(12) United States Patent
Guliani et al.

(10) Patent No.: US 9,715,930 B2
(45) Date of Patent: Jul. 25, 2017

(54) RESET CURRENT DELIVERY IN NON-VOLATILE RANDOM ACCESS MEMORY

(71) Applicant: Intel Corporation, Santa Clara, CA (US)

(72) Inventors: Sandeep K. Guliani, Folsom, CA (US); Ved Pragyan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 14/731,212

(22) Filed: Jun. 4, 2015

(65) Prior Publication Data

US 2016/0358652 A1    Dec. 8, 2016

(51) Int. Cl.
*G11C 13/00* (2006.01)
*G06F 12/0891* (2016.01)

(52) U.S. Cl.
CPC ...... *G11C 13/0097* (2013.01); *G06F 12/0891* (2013.01); *G11C 13/0038* (2013.01)

(58) Field of Classification Search
None
See application file for complete search history.

(56) References Cited

U.S. PATENT DOCUMENTS

| 9,312,005 | B2 * | 4/2016 | Castro ............ G11C 13/0004 |
| 2006/0002172 | A1 | 1/2006 | Venkataraman et al. |
| 2006/0126380 | A1 | 6/2006 | Osada et al. |
| 2007/0171705 | A1 | 7/2007 | Parkinson |
| 2009/0027975 | A1 | 1/2009 | Kang et al. |
| 2012/0287698 | A1 | 11/2012 | Lowrey et al. |

FOREIGN PATENT DOCUMENTS

WO    WO2013036244    *    3/2013    ............ G11C 7/10

OTHER PUBLICATIONS

International Search Report and Written Opinion mailed Aug. 2, 2016, issued in corresponding International Application No. PCT/US2016/029205, 12 pages.

* cited by examiner

*Primary Examiner* — James G Norman
(74) *Attorney, Agent, or Firm* — Schwabe, Williamson & Wyatt, P.C.

(57) ABSTRACT

Embodiments of the present disclosure describe techniques and configurations for providing a reset current to a non-volatile random access memory (NVRAM), such as a phase change memory (PCM) device. In an embodiment, the apparatus may comprise an NVRAM device; a selection mirror circuit coupled with the NVRAM device to apply a selection mirror voltage to the NVRAM device, to select a memory cell of the NVRAM device; and a reset mirror circuit coupled with the NVRAM device to apply a reset mirror voltage to the memory cell of the NVRAM device, subsequent to the application of the selection mirror voltage, to reset the memory cell. The reset mirror voltage may be lower than the selection mirror voltage, to facilitate delivery of a reset current above a current threshold to the memory cell. Other embodiments may be described and/or claimed.

18 Claims, 4 Drawing Sheets

RESET CURRENT DELIVERY IN NON-VOLATILE RANDOM ACCESS MEMORY

FIELD

Embodiments of the present disclosure generally relate to the field of integrated circuits, and more particularly, to set and reset operation in non-volatile random access memory (NVRAM) devices, such as phase change memory devices.

BACKGROUND

Phase change memory (PCM) technology such as multi-stack cross-point PCM is a promising alternative to other non-volatile (NV) memory technology, commonly known as non-volatile random access memory (NVRAM). Presently, reset current delivery has been a challenge in PCM memory technology due to high cell current requirement and high word line and bit line path resistance. The current mirror architecture used for reset current delivery has limited reset current delivery capability because the negative power supply of the reset current mirror may typically be set to be the inhibit voltage of the cross-point array, in order to avoid false selection of memory cells in the cross point array.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Techniques for providing a reset current to an NVRAM device, such as a PCM device, are discussed herein. In one instance, the apparatus may comprise an NVRAM (e.g., PCM) device; a selection mirror circuit coupled with the NVRAM device to apply a selection mirror voltage to the NVRAM device, to select a memory cell of the NVRAM device; and a reset mirror circuit coupled with the NVRAM device to apply a reset mirror voltage to the memory cell of the NVRAM device, subsequent to the application of the selection mirror voltage, to reset the memory cell. The reset mirror voltage may be lower than the selection mirror voltage, to facilitate delivery of a reset current above a current threshold to the memory cell.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality.

Figure 1:
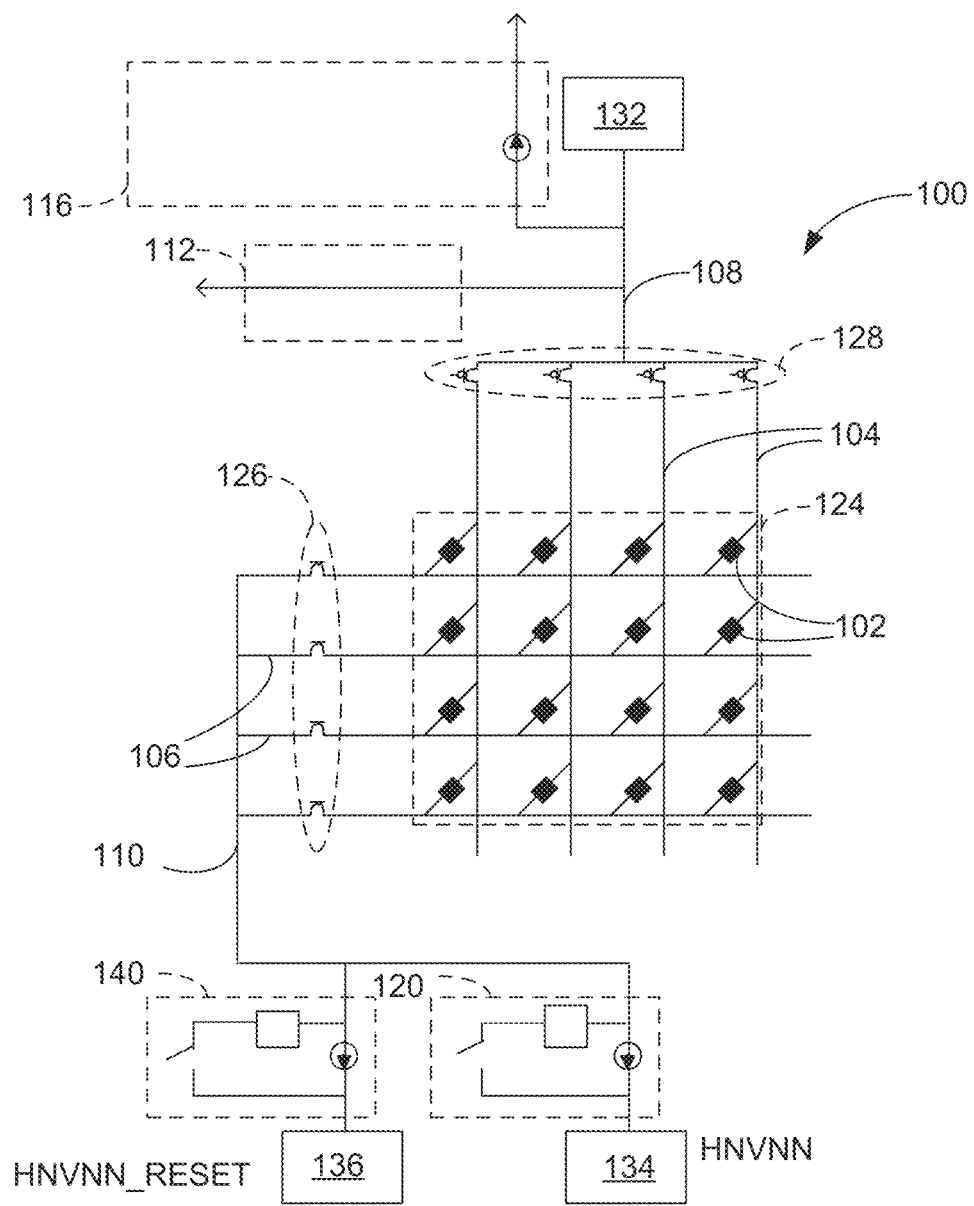
FIG. 1 is an example circuitry of an NVRAM device, such as a PCM device, in accordance with some embodiments.

FIG. 1 schematically illustrates example apparatus 100 of an NVRAM device, such as a PCM device in accordance with some embodiments. According to various embodiments, the apparatus 100 may include one or more memory cells (hereinafter "memory cells 102"), which may be configured in an array as shown. The memory cells 102 may include, for example, a phase change material such as a chalcogenide glass that can be switched between crystalline and amorphous states with the application of heat produced by an electric current. The state (e.g., crystalline/amorphous) of the phase change material may correspond with a logical value (e.g., 1 or 0) of the memory cells 102. The apparatus 100 may be part of a phase change memory and switch (PCMS) device in some embodiments. The memory cells 102 may include a switch such as, for example, an ovonic threshold switch (OTS) configured for use in selection/programming operations of the memory cells 102. In other embodiments, the apparatus 100 may be part of other suitable types of memory devices. Regardless, as will be described in more detail below, the apparatus 100 may be incorporated with the reset current delivery technology of the present disclosure to facilitate delivery of a reset current above a current threshold to the memory cells.

The apparatus 100 may further include one or more bit lines (hereinafter "bit lines 104") and one or more word lines (hereinafter "word lines 106") coupled to the memory cells 102, as can be seen. The bit lines 104 and word lines 106 may be configured such that each of the memory cells 102 is disposed at an intersection of each individual bit line and word line. A voltage or bias can be applied to a target memory cell of the memory cells 102 using the word lines 106 and the bit lines 104 to select the target cell for a read or write operation. Bit line drivers 128 may be coupled to the bit lines 104 and word line drivers 126 may be coupled to the word lines 106 to facilitate decoding/selection of the one or more memory cells 102, as shown.

In embodiments, the cells 102, word line 106 and bit lines 106 may be organized to form a cross-point memory array. For example, the apparatus 100 may include one or more tiles 124. The one or more tiles 124 may comprise a portion of the array of one or more word lines 106, bit lines 104, and memory cells 102 that is treated as a discrete unit during a selection operation of a target memory cell. That is, in some embodiments, each of the one or more tiles 124 is a unit of the array that is biased to select the target memory cell (e.g., a bit) in the array. In the depicted embodiment, the one or more tile decks 124 comprise an array of four word lines by four bit lines (4 WL×4 BL); however, other tile deck sizes can be used in other embodiments including, for example, a tile deck size of one thousand word lines by one thousand bit lines (1000 WL×1000 BL). The one or more tile decks 124 may be part of any memory layer of a stacked memory configuration in some embodiments. For example, the one or more decks 124 may be part of a memory layer formed on another memory layer, in some embodiments.

The bit lines 104 may be coupled to a bit line electrode (global bit line) 108, which may be further coupled to a bit line supply 132 that is configured to provide an electrical supply for the bit lines 104. The word lines 106 may be coupled to a word line electrode (global word line) 110, which may be further coupled to a word line voltage supply 134 that is configured to provide an electrical supply (voltage HNVNN) for the word lines 106. The bit line electrode 108 and the word line electrode 110 may each be a current path to the memory cells 102. The word line drivers 126 and the bit line drivers 128 may each comprise single or multiple transistors per electrode according to various embodiments.

In an embodiment, the apparatus 100 may include sensing circuitry 112 coupled to the bit line electrode 108. The sensing circuitry 112 may use the bit line electrode 108 as an electrical node for performing a read operation, such as a sense operation, of the memory cells 102. The apparatus 100 may further include write circuitry 116 coupled to the bit line electrode 108. The write circuitry 116 may use the bit line electrode 108 as an electrical node for performing a write operation, such as a set or reset operation, of the memory cells 102. The apparatus 100 may further include components of a selection module coupled to the word line electrode 110, to facilitate a selection operation of the memory cells 102 using the word line electrode 110. In embodiments, the selection module may comprise a selection mirror circuit 120 fed by voltage supply 134 (HNVNN). In embodiments, the HNVNN voltage may be negative and may be about −3.5 V, which may approximate the inhibit voltage of the cross point memory array comprising the PCM device of the apparatus 100.

The selection operation may precede a read/write operation and place the target memory cell in a state to receive a read/write operation. During selection, a target memory cell may be moved from a subthreshold region of operation to a region of operation above a threshold region of operation by applying a voltage/bias across the target memory cell. The voltage bias to achieve selection of the target cell may be provided by word line and bit line driver circuitry, which may include the selection mirror circuit 120 for the respective target word line.

The target word line bias and the target bit line bias may be designed or selected such that, in combination, an overall bias is applied across the target cell that is sufficient to bring the target memory cell above a threshold voltage. The transition from subthreshold to the threshold or above threshold region may involve a "snap-back" event where the voltage sustained by the target cell for a given current through the cell may be suddenly reduced (see FIG. 2, for example). The selection mirror circuit 120 may provide a desired level of the current to flow through the selected one of the memory cells 102.

The selection mirror circuit 120 may comprise a transistor gate that is configured to limit a current of the word line electrode 110 to a desired current level. For example, the transistor may be an n-type transistor having a gate that is controlled to an analog level such that the transistor delivers up to a desired current. The selection mirror circuit 120 may be enabled by applying a gate voltage (supplied by HNVNN 134) to the transistor. The selection mirror circuit 120 may include additional control circuitry to facilitate decoding of a target memory cell of the one or more memory cells 102 such that the target memory cell is moved from a subthreshold region of operation to a region of operation above a threshold region of operation, to select the target memory cell.

The apparatus 100 may further include a reset module, e.g., comprising a reset mirror circuit 140, to apply a reset mirror voltage to the target memory cell of the memory cells 102 of the apparatus 100, subsequent to the application of the selection mirror voltage, to reset the selected target memory cell. The reset mirror circuit 140 may be configured similarly to the selection mirror circuit, e.g., may include a transistor-based switch to control reset current. The reset mirror circuit 140 may include a reset voltage supply 136 (HNVNN_RESET). In embodiments, the voltage supply HNVNN_RESET for the reset mirror circuit 140 may be lower (e.g., have a higher negative value) than HNVNN (which may be set to a value of inhibit voltage of the apparatus 100, as described above). For example, HNVNN_RESET may be about −4.25 V. The voltage supply for the selection mirror circuit 120 may not be more negative than the inhibit voltage of the array because otherwise de-selected cells on the word line (e.g., low-threshold A-type cells) may get falsely selected and cause a bit error.

In operation, during selection of a target memory cell of memory cells 102, the selection mirror circuit 120 may be used to apply voltage to a word line to select the target memory cell. The selection mirror circuit 120 may use a current that is sufficient to keep the target memory cell on. After target memory cell selection, the selection mirror circuit 120 may be switched off and the reset mirror circuit 140 may be switched on to deliver reset current. As indicated above, the reset mirror circuit 140 uses a more negative voltage supply HNVNN_RESET than the selection mirror circuit 120. The reset mirror circuit 140 may use a more negative voltage supply because during the reset pulse, there may be sufficient IR drop from HNVNN_RESET supply to a selected word line. This drop may ensure that the selected word line satisfies the inhibit voltage requirement (e.g., >−3.5 V).

According to various embodiments, the sensing circuitry 112, the write circuitry 116, the selection mirror circuit 120, and the reset mirror circuit 140 may include or be part of other suitable circuitry or modules. For example, in some embodiments, the features 112, 116, 120, and 140 may be suitably combined in one or more modules or may be coupled with the other of the bit line electrode 108 and/or word line electrode 110 than depicted. The apparatus 100 may be configured to perform actions of methods described herein, according to various embodiments. For example, the apparatus 100 may be coupled with one or more control modules configured to perform select and/or reset operations of a memory cell, according to embodiments described herein.

Figure 2:
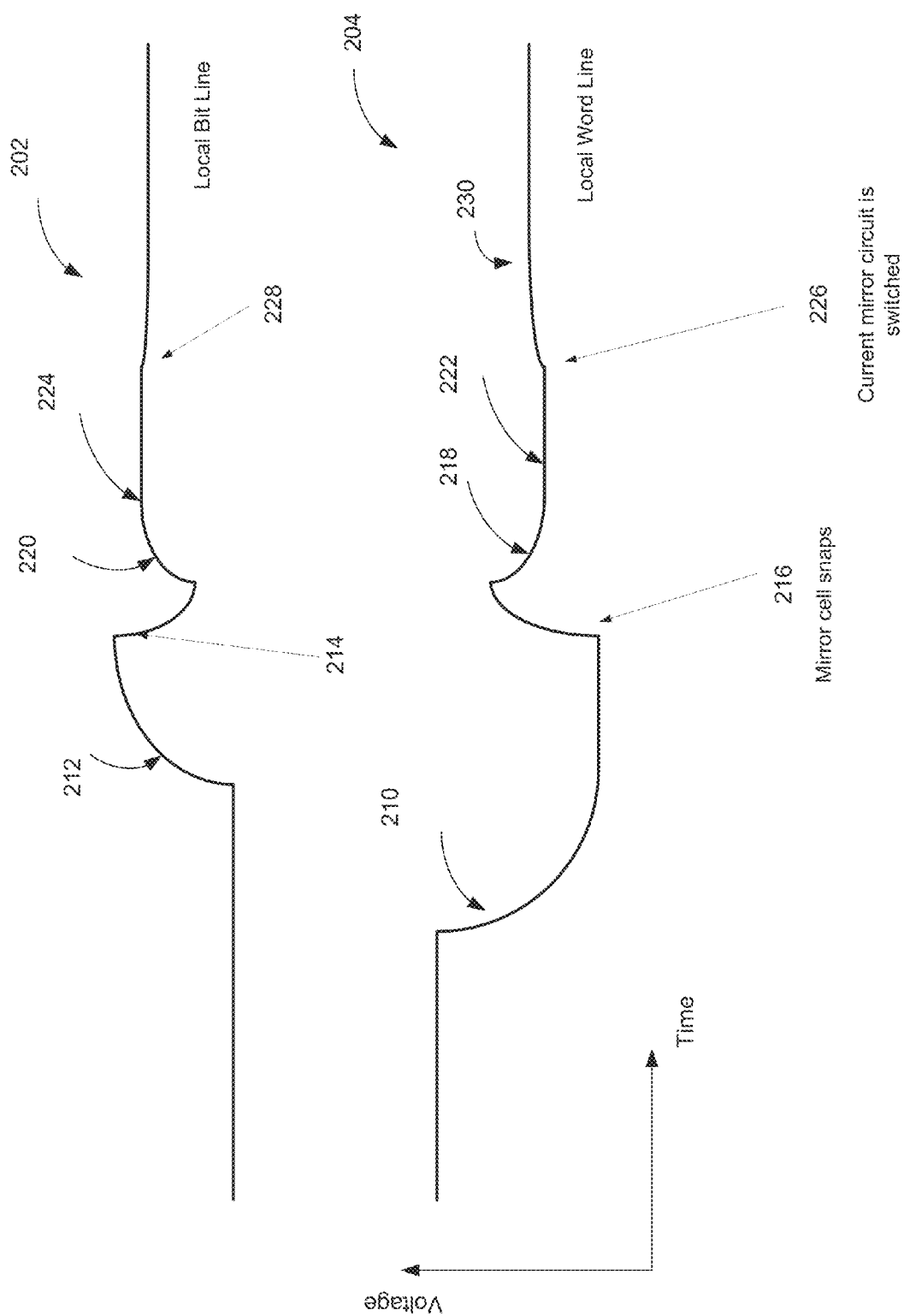
FIG. 2 is an example diagram illustrating a reset operation of an NVRAM (e.g., PCM) device, in accordance with some embodiments.

FIG. 2 is an example diagram illustrating a reset operation of an NVRAM (e.g., PCM) device, in accordance with some embodiments. More specifically, the waveform 202 illustrates voltage change on a selected (local) bit line, and the waveform 204 illustrates voltage change on a selected (local) word line, in response to selection and reset of a target memory cell of the NVRAM device, such as memory cell 102 of the apparatus 100 of FIG. 1.

When a memory cell selection operation commences, a selection mirror circuit (e.g., 120) may apply selection voltage to the word line, in order to select the word line. As indicated by numeral 210 on the waveform 204, the word line voltage may go down (e.g., may be taken negative), for example, to a level of inhibit voltage value. Then, the voltage on the bit line may ramp up (indicated by numeral 212 on the waveform 202) as the bit line gets charged. The target memory cell may snap back (turn on) when the voltage across the cell exceeds the threshold voltage, as indicated by numerals 214 and 216 on the waveforms 202 and 204 respectively. Accordingly, the voltage on the word line may go up (indicated by 218) and the voltage on the bit line may go down (indicated by 220), and eventually settle to voltage (indicated by numerals 222 and 224 respectively) that is sufficient to supply memory cell selection current to the cell.

About the time when the voltage on bit line and word line settles (222, 224), the current mirror circuit may be switched off and the reset mirror circuit may be switched on, as indicated by numerals 226 and 228 on waveforms 204 and 202 respectively. In a reset operation, an amount of current (e.g., a reset current) may be applied for an amount of time (e.g., a reset time) to transform the phase change material of the memory cell from a crystalline state to an amorphous state. Although the voltage supply provided by the reset mirror circuit is more negative than the voltage supply provided by the select ion mirror circuit, due to high IR drop from the word line to the negative supply during reset pulse, the word line may stay within the inhibit voltage, as indicated by numeral 230. Due to lower HNVNN_RESET supply, more reset current may be delivered to the target memory cell, compared to conventional techniques.

Figure 3:
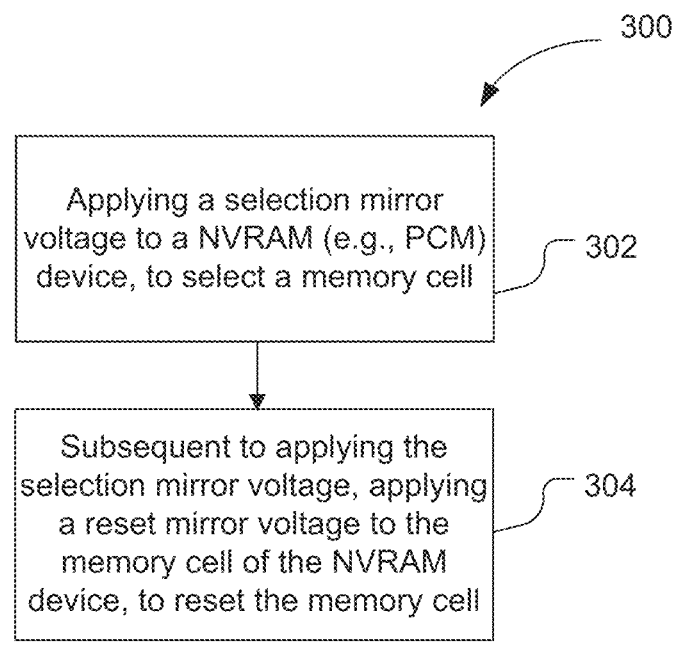
FIG. 3 is an example process flow diagram of a method 300 for performing a reset operation of an NVRAM (e.g., PCM) device, in accordance with some embodiments.

FIG. 3 is an example process flow diagram of a method 300 for performing a reset operation of an NVRAM (e.g., PCM) device, in accordance with some embodiments. The method 300 may comport with embodiments described in connection with FIGS. 1-2 and vice versa.

At block 302, the method 300 may include applying a selection mirror voltage to an NVRAM device (e.g., apparatus 100 of FIG. 1), to select a memory cell (e.g., one of memory cells 102 of FIG. 1). The applied voltage may be a voltage greater than a threshold voltage of the memory cell to cause the memory cell to transition from an off-state to an on-state. In some embodiments, the applied voltage may be approximately equal to an inhibit voltage associated with the NVRAM device. The selection mirror voltage may be provided by the selection mirror circuit coupled with the NVRAM device.

At block 304, the method 300 may include, subsequent to applying the selection mirror voltage, applying a reset mirror voltage to the memory cell of the NVRAM device, to reset the memory cell, e.g., to convert the phase change material of the memory cell from a crystalline state to an amorphous state. The reset mirror voltage may be lower (e.g., negative-higher) than the selection mirror voltage, to facilitate delivery of a reset current above a current threshold to the memory cell. The reset mirror voltage may be provided by a reset mirror circuit coupled with the NVRAM device.

The actions of the method 300 or other techniques described herein may be performed by any suitable module. For example, one or more control modules may be coupled to control the apparatus 100 of FIG. 1 to perform the actions described herein. Accordingly, an article of manufacture is disclosed herein. In some embodiments, the article of manufacture may include a non-transitory computer-readable storage medium. The article of manufacture may have instructions stored thereon that, in response to execution by a processor, cause the actions described herein to be performed. Any suitable apparatus including, for example, a PCM device may be equipped with any suitable means (e.g., the one or more control modules and/or apparatus 100 of FIG. 1) configured to perform actions described herein.

Figure 4:
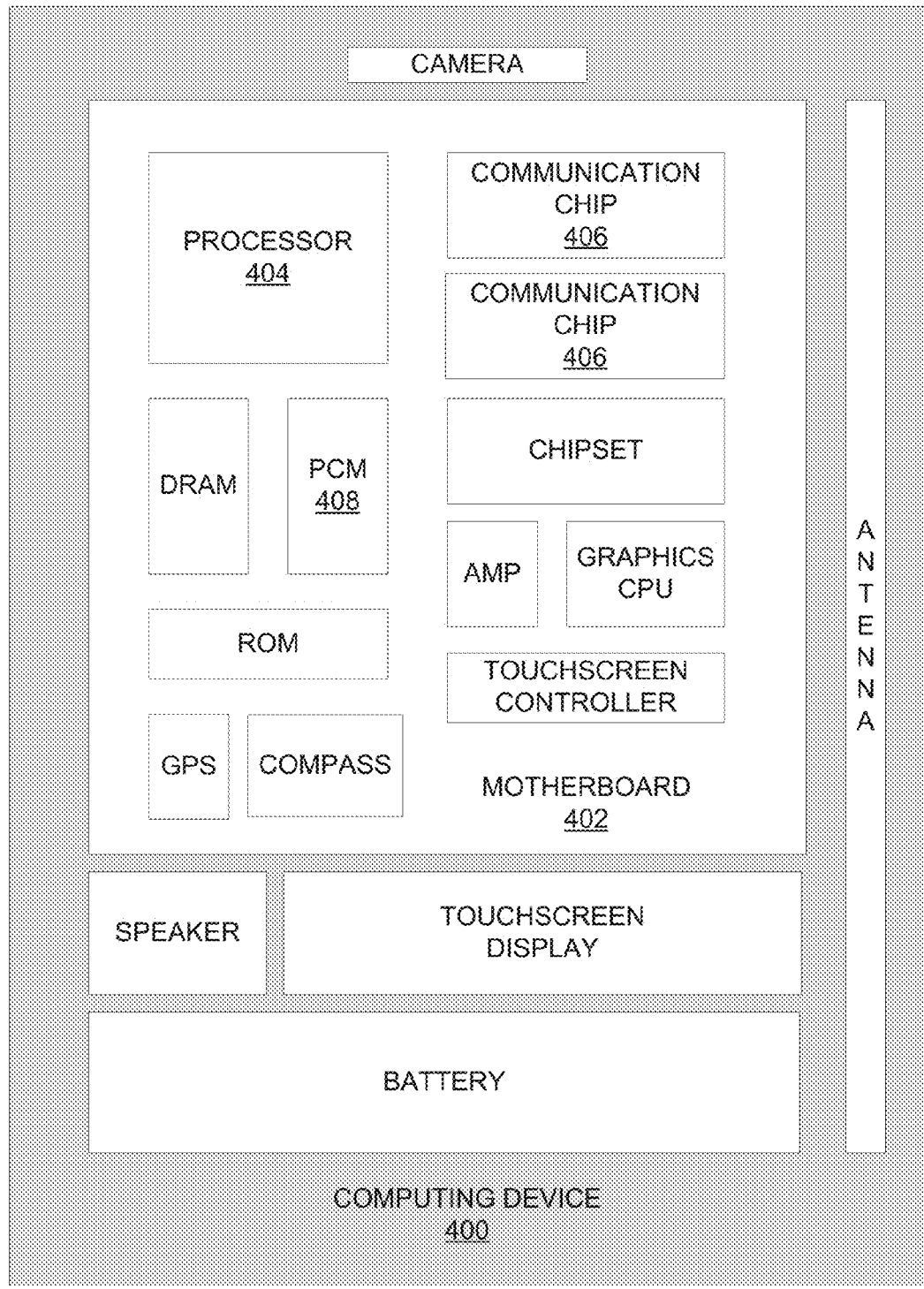
FIG. 4 is an example system that includes an NVRAM (e.g., PCM) device in accordance with various embodiments described herein.

Embodiments of the present disclosure may be implemented into a system using any suitable hardware and/or software to configure as desired. FIG. 4 schematically illustrates an example system (e.g., a computing device 400) that includes an NVRAM (e.g., PCM) device 408 having circuitry (e.g., circuitry 100 or 200 of FIG. 1 or 2) configured to perform actions in accordance with various embodiments described herein. The computing device 400 may house a board such as motherboard 402. The motherboard 402 may include a number of components, including but not limited to a processor 404 and at least one communication chip 406. The processor 404 may be physically and electrically coupled to the motherboard 402. In some implementations, the at least one communication chip 406 may also be physically and electrically coupled to the motherboard 402. In further implementations, the communication chip 406 may be part of the processor 404.

Depending on its applications, computing device 400 may include other components that may or may not be physically and electrically coupled to the motherboard 402. These other components may include, but are not limited to, volatile memory (e.g., DRAM), earlier described non-volatile memory (e.g., phase change memory (PCM) 408 or ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

According to various embodiments, the PCM 408 may include circuitry (e.g., circuitry 100 or 200 of FIG. 1 or 2) that is configured to perform actions (e.g., method 400 or 500 of FIG. 4 or 5) described herein. For example, the PCM 408 may be configured to perform write operations (e.g., set or reset operations) using parasitic effects.

The communication chip 406 may enable wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they may not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

In various implementations, the computing device 400 may be mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

The following paragraphs describe examples of various embodiments.

Example 1 is an apparatus, comprising: a non-volatile random access memory (NVRAM) device; a selection mirror circuit coupled with the NVRAM device to apply a selection mirror voltage to the NVRAM device, to select a memory cell of the NVRAM device; and a reset mirror circuit coupled with the NVRAM device to apply a reset mirror voltage to the memory cell of the NVRAM device, subsequent to the application of the selection mirror voltage, to reset the memory cell, wherein the reset mirror voltage is lower than the selection mirror voltage, to facilitate delivery of a reset current above a current threshold to the memory cell.

Example 2 may include the subject matter of Example 1, wherein the selection mirror circuit to apply a selection mirror voltage includes to apply a voltage value that is approximately equal to an inhibit voltage associated with the NVRAM device.

Example 3 may include the subject matter of Example 1, wherein the NVRAM device is a PCM device, and wherein the memory cell includes a phase change material coupled with an ovonic threshold switch (OTS), and wherein the reset mirror voltage, applied to the memory cell, is to convert the phase change material from a crystalline state to an amorphous state.

Example 4 may include the subject matter of Example 1, wherein the select mirror voltage is about −3.5 V, wherein the reset mirror voltage is about −4.25 V.

Example 5 may include the subject matter of Example 1, wherein the reset mirror circuit to apply a reset mirror voltage to the memory cell of the NVRAM device, subsequent to the application of the selection mirror voltage, includes to apply the reset mirror voltage after a snap-back event of the memory cell, wherein the snap-back event occurs in response to the application of the selection mirror voltage to the NVRAM device.

Example 6 may include the subject matter of Example 5, wherein the memory cell is coupled with a word line of the NVRAM device, and wherein the selection mirror circuit and reset mirror circuit are selectively connected with the word line, to apply the selection mirror voltage and reset mirror voltage to the memory cell.

Example 7 may include the subject matter of Example 6, wherein the snap-back event occurs when a voltage across the memory cell exceeds a threshold voltage, in response to the application of the selection mirror voltage to the word line.

Example 8 may include the subject matter of Example 1, wherein the NVRAM device comprises a cross-point memory array.

Example 9 may include the subject matter of any of Examples 1 to 8, wherein the apparatus is disposed on an integrated circuit.

Example 10 is a method comprising: applying a selection mirror voltage to a non-volatile random access memory (NVRAM) device, to select a memory cell of the NVRAM device; and subsequent to applying the selection mirror voltage, applying a reset mirror voltage to the memory cell of the NVRAM device, to reset the memory cell, wherein the reset mirror voltage is lower than the selection mirror voltage, to facilitate delivery of a reset current above a current threshold to the memory cell.

Example 11 may include the subject matter of Example 10, wherein applying a selection mirror voltage includes applying voltage that is approximately equal to an inhibit voltage associated with the NVRAM device.

Example 12 may include the subject matter of Example 10, wherein applying a selection mirror voltage to an NVRAM device includes: coupling a selection mirror circuit with the NVRAM device; and providing the selection mirror voltage, with the selection mirror circuit, to the NVRAM device.

Example 13 may include the subject matter of Example 10, wherein applying a reset mirror voltage to the memory cell of the NVRAM device includes: coupling a reset mirror circuit with the NVRAM device; and providing the reset mirror voltage, with the reset mirror circuit, to the memory cell.

Example 14 may include the subject matter of Example 12, wherein coupling a selection mirror circuit with the NVRAM device includes connecting the selection mirror circuit with a word line of the NVRAM device, wherein the memory cell is coupled with the word line.

Example 15 may include the subject matter of Example 14, wherein coupling a reset mirror circuit with the NVRAM device includes connecting the reset mirror circuit with the word line of the NVRAM device.

Example 16 may include the subject matter of any of Examples 10 to 15, wherein applying a reset mirror voltage includes applying the reset mirror voltage after a snap-back event of the memory cell, wherein the snap-back event occurs in response to applying the selection mirror voltage to the NVRAM device, wherein the NVRAM device is a phase change memory (PCM) device.

Example 17 is a mobile device, comprising: a processor; and a memory coupled with the processor, wherein the memory includes: a phase change memory (PCM) device; a selection mirror circuit coupled with the PCM device to apply a selection mirror voltage to the PCM device, to select a memory cell of the PCM device; and a reset mirror circuit coupled with the PCM device to apply a reset mirror voltage to the memory cell of the PCM device, subsequent to the application of the selection mirror voltage, to reset the memory cell, wherein the reset mirror voltage is lower than the selection mirror voltage, to facilitate delivery of a reset current above a current threshold to the memory cell.

Example 18 may include the subject matter of example 17, wherein the reset mirror circuit to apply a reset mirror voltage to the memory cell of the PCM device, subsequent to the application of the selection mirror voltage, includes to apply the reset mirror voltage after a snap-back event of the memory cell, wherein the snap-back event occurs in response to the application of the selection mirror voltage to the PCM device.

Example 19 may include the subject matter of Example 18, wherein the memory cell is coupled with a word line of the PCM memory device, and wherein the selection mirror circuit and reset mirror circuit are connectable with the word line, to apply the selection mirror voltage and reset mirror voltage to the memory cell.

Example 20 may include the subject matter of Example 19, wherein the snap event occurs when a voltage across the memory cell exceeds a threshold voltage, in response to the application of the selection mirror voltage to the word line.

Example 21 may include the subject matter of any of Examples 17 to 19, wherein the selection mirror circuit to apply a selection mirror voltage includes to apply a voltage value that is approximately equal to an inhibit voltage associated with the PCM memory device.

Computer-readable media (including non-transitory computer-readable media), methods, apparatuses, systems, and devices for performing the above-described techniques are illustrative examples of embodiments disclosed herein. Additionally, other devices in the above-described interactions may be configured to perform various disclosed techniques.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

What is claimed is:

1. An apparatus, comprising:
a non-volatile random access memory (NVRAM) device;
a selection mirror circuit coupled with the NVRAM device to apply a selection mirror voltage to a word line of the NVRAM device to select a memory cell of the NVRAM device, wherein the selection mirror voltage approximates an inhibit voltage associated with the NVRAM device, wherein a voltage on the word line decreases to a level of the inhibit voltage, then increases at a snap-back event associated with the memory cell, and then settles to a level sufficient to supply a selection current to the memory cell; and
a reset mirror circuit coupled with the NVRAM device to apply a reset mirror voltage that is lower than the selection mirror voltage, to the selected memory cell of the NVRAM device, subsequent to the application of the selection mirror voltage, to facilitate delivery of a reset current above a current threshold to the memory cell, to reset the memory cell, wherein the reset mirror circuit is to switch on to apply the reset mirror voltage when the word line voltage settles to the level sufficient to supply the selection current to the memory cell, wherein in response to the application of the reset mirror voltage, the word line voltage settles substantially within the inhibit voltage level.

2. The apparatus of claim 1, wherein the NVRAM device is a PCM device, and wherein the memory cell includes a phase change material coupled with an ovonic threshold switch (OTS), and wherein the reset mirror voltage, applied to the memory cell, is to convert the phase change material from a crystalline state to an amorphous state.

3. The apparatus of claim 1, wherein the selection mirror voltage is about −3.5 V, wherein the reset mirror voltage is about −4.25 V.

4. The apparatus of claim 1, wherein the reset mirror circuit is to apply the reset mirror voltage after the snap-back event of the memory cell, wherein the snap-back event occurs in response to the application of the selection mirror voltage to the NVRAM device.

5. The apparatus of claim 4, wherein the memory cell is coupled with the word line of the NVRAM device, and wherein the selection mirror circuit and reset mirror circuit are selectively connected with the word line, to apply the selection mirror voltage and reset mirror voltage to the memory cell.

6. The apparatus of claim 5, wherein the snap-back event occurs when a voltage across the memory cell exceeds a threshold voltage, in response to the application of the selection mirror voltage to the word line.

7. The apparatus of claim 1, wherein the NVRAM device comprises a cross-point memory array.

8. The apparatus of claim 1, wherein the apparatus is disposed on an integrated circuit.

9. A method comprising:
applying a selection mirror voltage to a memory cell of a non-volatile random access memory (NVRAM) device, including providing the selection mirror voltage that approximates an inhibit voltage associated with the NVRAM device to a word line of the NVRAM device, wherein in response to applying the selection mirror voltage, a voltage on the word line decreases to a level of the inhibit voltage, then increases at a snap-back event associated with the memory cell, and then settles to a level sufficient to supply a selection current to the memory cell; and
subsequent to applying the selection mirror voltage, applying a reset mirror voltage that is lower than the selection mirror voltage, to the selected memory cell of the NVRAM device, to facilitate delivery of a reset current above a current threshold to the memory cell, to reset the memory cell, wherein applying the reset mirror voltage includes switching on a reset mirror circuit coupled with the NVRAM device to provide the reset mirror voltage when the word line voltage settles to the level sufficient to supply the selection current to the memory cell, wherein in response to the application of the reset mirror voltage, the word line voltage settles substantially within the inhibit voltage level.

10. The method of claim 9, wherein applying the selection mirror voltage to the memory cell of the NVRAM device includes:
coupling a selection mirror circuit with the NVRAM device; and
providing the selection mirror voltage, with the selection mirror circuit, to the NVRAM device.

11. The method of claim 9, wherein applying the reset mirror voltage to the memory cell of the NVRAM device includes:
coupling the reset mirror circuit with the NVRAM device.

12. The method of claim 10, wherein coupling the selection mirror circuit with the NVRAM device includes connecting the selection mirror circuit with the word line of the NVRAM device, wherein the memory cell is coupled with the word line.

13. The method of claim 12, wherein coupling the reset mirror circuit with the NVRAM device includes connecting the reset mirror circuit with the word line of the NVRAM device.

14. The method of claim 9, wherein applying the reset mirror voltage includes applying the reset mirror voltage after the snap-back event of the memory cell, wherein the snap-back event occurs in response to applying the selection mirror voltage to the NVRAM device, wherein the NVRAM device is a phase change memory (PCM) device.

15. A mobile device, comprising:
a processor; and
a memory coupled with the processor, wherein the memory includes:
a phase change memory (PCM) device;
a selection mirror circuit coupled with the PCM device to apply a selection mirror voltage to a word line of the NVRAM device to select a memory cell of the PCM device, wherein the selection mirror voltage approximates an inhibit voltage associated with the PCM device, wherein a voltage on the word line decreases to a level of the inhibit voltage, then increases at a snap-back event associated with the memory cell, and then settles to a level sufficient to supply a selection current to the memory cell; and
a reset mirror circuit coupled with the PCM device to apply a reset mirror voltage that is lower than the selection mirror voltage, to the memory cell of the PCM device, subsequent to the application of the selection mirror voltage, to facilitate delivery of a reset current above a current threshold to the memory cell, to reset the memory cell, wherein the reset mirror circuit is to switch on to apply the reset mirror voltage when the word line voltage settles to the level sufficient to supply the selection current to the memory cell, wherein in response to the application of the reset mirror voltage, the word line voltage settles substantially within the inhibit voltage level.

16. The mobile device of claim 15, wherein the reset mirror circuit is to apply the reset mirror voltage after the snap-back event of the memory cell, wherein the snap-back event occurs in response to the application of the selection mirror voltage to the PCM device.

17. The mobile device of claim 16, wherein the memory cell is coupled with the word line of the PCM memory device, and wherein the selection mirror circuit and reset mirror circuit are connectable with the word line, to apply the selection mirror voltage and reset mirror voltage to the memory cell.

18. The mobile device of claim 17, wherein the snap-back event occurs when a voltage across the memory cell exceeds a threshold voltage, in response to the application of the selection mirror voltage to the word line.

* * * * *